United States Patent [19]

Yoneda et al.

[11] 4,273,856
[45] Jun. 16, 1981

[54] POSITIVE RESIST TERPOLYMER COMPOSITION AND METHOD OF FORMING RESIST PATTERN

[75] Inventors: Yasuhiro Yoneda; Toshisuke Kitakohji, both of Yokohama; Kenro Kitamura, Fujisawa, all of Japan

[73] Assignee: Fujitsu Limited, Japan

[21] Appl. No.: 112,309

[22] PCT Filed: Jul. 2, 1979

[86] PCT No.: PCT/JP78/00021

§ 371 Date: Jul. 2, 1979

§ 102(e) Date: Jul. 7, 1979

[87] PCT Pub. No.: WO79/00283

PCT Pub. Date: May 31, 1979

[30] Foreign Application Priority Data

Nov. 7, 1977 [JP] Japan .................... 52-133336

[51] Int. Cl.³ .................................................. G23C 1/68
[52] U.S. Cl. .................................... 430/270; 427/43.1; 430/296; 430/326; 430/942; 526/291
[58] Field of Search ............... 427/43.1; 430/270, 296, 430/326, 942; 526/291

[56] References Cited

U.S. PATENT DOCUMENTS

| | | | |
|---|---|---|---|
| 3,981,985 | 9/1976 | Roberts | 430/296 |
| 4,061,832 | 12/1977 | Roberts | 430/296 |

FOREIGN PATENT DOCUMENTS 51-117577 10/1976 Japan .

*Primary Examiner*—Jack P. Brammer
*Attorney, Agent, or Firm*—Staas & Halsey

[57] ABSTRACT

A cross-linkable positive-working ionizing radiation-resist or ultraviolet ray-resist polymer composition comprising, in polymerized form, (a) from about 70 to about 99% by mole of units derived from a methacrylic acid ester of the formula:

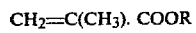

$$CH_2=C(CH_3) \cdot COOR$$

where R is an alkyl or haloalkyl group having from 1 to 6 carbon atoms, a benzyl group or a cyclohexyl group, (b) from about 1 to about 20% by mole of units derived from methacrylamide, and (c) from about 0.05 to about 20% by mole of units derived from methacrylic acid chloride;

each amount of the units (a), (b) and (c) being based on the total moles of the units (a), (b) and (c). The polymer composition is preferably in the form of either a copolymer comprised of the units (a), (b) and (c), or a blend of a copolymer comprised of the units (b) and a portion of the units (a) and a copolymer comprised of the units (c) and the remainder of the units (a). The resist polymer composition exhibits enhanced sensitivity as well as good thermal resistance, contrast and resolution.

7 Claims, No Drawings

POSITIVE RESIST TERPOLYMER COMPOSITION AND METHOD OF FORMING RESIST PATTERN

DESCRIPTION

BACKGROUND OF THE INVENTION

This invention relates to a cross-linkable positive-working ionizing radiation-resist or ultraviolet ray-resist polymer composition and to a method of forming a positive resist pattern on a substrate using the resist polymer composition.

Polymethyl methacrylates have heretofore been widely used as positive-working resists in electron or X-ray lithography. Although the polymethyl methacrylate resists exhibit satisfactory resolution, their sensitivity to radiation is poor. In other words, there is only a slight difference in solubility between irradiated regions and non-irradiated regions, particularly at low ionizing radiation exposures. Accordingly, it has eagerly been desired to provide polymeric resist materials exhibiting a resolution approximately similar to and a sensitivity far greater than those of the conventional polymethyl methacrylate resists.

In order to provide methyl methacrylate polymer resists of improved sensitivity, it has been proposed to copolymerize methyl methacrylate with a sensitivity-enhancing acrylic monomer such as hexafluorobutyl methacrylate. However, such a methyl methacrylate copolymer resist is still unsatisfactory in that it has an undesirably low softening point and a poor thermal resistance as compared with the conventional polymethyl methacrylate resists.

In U.S. Pat. No. 3,981,985, a mixture comprised of (a) a copolymer of a monoolefinically unsaturated carboxylic acid, such as methacrylic acid, and a monoolefinically unsaturated compound, such as methyl methacrylate, and (b) a copolymer of a monoolefinically unsaturated carboxylic acid chloride, such as methacrylic acid chloride and a monoolefinically unsaturated compound was also proposed for use as a polymer resist. The proportions of the two copolymers (a) and (b) in this mixture are such that the carboxylic acid and the carboxylic acid chloride are essentially stoichiometric. When a resist coating of this mixture is heated, carboxylic acid anhydride cross-links are formed, and thus the resist coating becomes thermally resistant. However, the sensitivity of this resist coating is still not completely satisfactory.

SUMMARY OF THE INVENTION

The main object of the present invention is to provide positive-working ionizing radiation-resist or ultraviolet ray-resist polymeric materials which exhibit enhanced sensitivity as well as good thermal resistance, contrast and resolution.

The other objects and advantages of the present invention will be apparent from the following description.

One aspect of the present invention provides a cross-linkable positive-working ionizing radiation-resist or ultraviolet ray-resist polymer composition, comprising, in polymerized form, (a) approximately 70 to 99% by mole of units derived from a methacrylic acid ester of the formula:

$$CH_2=C(CH_3).COOR$$

wherein R is an alkyl or haloalkyl group having from 1 to 6 carbon atoms, a benzyl group or a cyclohexyl group, (b) approximately 1 to 20% by mole of units derived from methacrylamide, and (c) approximately 0.05 to 20% by mole of units derived from methacrylic acid chloride;

each amount of the units (a), (b) and (c) being based on the total moles of the units (a), (b) and (c). The unexpected advantage of the present invention resides primarily in the fact that its sensitivity is far more enhanced than the sensitivity of the positive resist polymer composition described in U.S. Pat. No. 3,981,985, which contains substantially stoichiometric amounts of monoolefinically unsaturated carboxylic acid units and monoolefinically unsaturated carboxylic acid chloride units.

DETAILED DESCRIPTION

The positive resist polymer composition of the present invention is in the form of either a terpolymer comprised of the methacrylic acid ester units (a), the methacrylamide units (b) and the methacrylic acid chloride units (c), or a blend of at least two polymers, each of which is comprised of at least one of the units (a), (b) and (c). Preferably, the polymer composition is either the terpolymer of the units (a), (b) and (c) or a blend of a copolymer comprised of the units (a) and (b) with a copolymer comprised of the units (a) and (c).

When a coating of either of the above mentioned polymer compositions is applied to a substrate and heated, dehydrochlorination occurs between the acid amide groups and the acid chloride groups, and a three-dimensional network of acid imide cross-links is formed. This polymer network is insoluble in a solvent used as a developer. It is presumed that, when the polymer network is irradiated with ionizing radiation or ultraviolet rays, both the main chains and the cross-links of the polymer network are destroyed at the irradiated regions, and the polymers are degraded into lower molecular weight polymers. These degraded, lower molecular weight polymers are soluble in a developer solvent, and, when an irradiated pattern in the polymer resist is developed by using a solvent, the polymers in the irradiated regions are selectively removed so as to leave the positive resist pattern on the substrate.

The methacrylic acid esters used for the preparation of the positive resist polymer composition are esters of an alkyl or haloalkyl group having from 1 to 6 carbon atoms, a benzyl group and a cyclohexyl group. The methacrylic acid esters include, for example, methyl methacrylate, tert.-butyl methacrylate, iso-propyl methacrylate, hexafluorobutyl methacrylate, hexafluoroisopropyl methacrylate, cyclohexyl methacrylate and benzyl methacrylate. These methacrylic acid esters may be used either alone or in combination. The amount of the methacrylic acid esters may be varied in the range of from about 70 to about 99% by mole based on the total moles of all monomers used for the preparation of the polymer composition. When the amount of the methacrylic acid esters is too small, the sensitivity of the positive resists is poor. In contrast, when the amount of the methacrylic acid esters is too large, both the thermal resistance and solvent resistance of the polymer resists are poor.

The amount of methacrylamide may range from about 1 to about 20% by mole, preferably from about 2 to about 10% by mole, based on the total moles of all monomers used for the preparation of the polymer composition. When the amount of the methacrylamide is too small, the positive resists have, when heated, an undesirably low degree of cross-linking and are thus relatively soluble in a solvent developer and poor with respect to thermal resistance and sensitivity. In contrast, when the amount of the methacrylamide is too large, the degree of cross-linking is undesirably high and the sensitivity is quite poor.

The amount of methacrylic acid chloride may range of from about 0.05 to about 20% by mole, preferably from about 0.3 to about 3% by mole, based on the total moles of the monomers used for the preparation of the polymer composition. When the amount of methacrylic acid chloride is outside this range, the polymer resists are unsatisfactory, similar to the case where the amount of the methacrylamide is outside the above-mentioned range.

The polymer composition of the present invention may contain, in addition to the above-mentioned methacrylic acid ester, methacrylamide and methacrylic acid chloride units, usually less than 50% by weight, based on the total weight of the polymer composition of units derived from other monoolefinically unsaturated monomers, provided that the polymer resists are not harmfully influenced.

The molar ration of the methacrylamide to the methacrylic acid chloride should preferably be within the range of from about ⅔ to about 100/3 by mole in order to achieve the desired resist characteristics.

The polymer composition of the present invention, which is in the form of either a terpolymer of the above-mentioned units (a), (b) and (c), or a blend of polymers, each containing at least one of the units (a), (b) and (c), may be prepared in a conventional manner. The molecular weight of the polymer composition may range from about 30,000 to about 1,000,000, preferably from about 30,000 to about 400,000, as determined by a gel permeation chromatography procedure. The ratio of the weight average molecular weight to the number average molecular weight may range from 1/1 to 4/1, preferably from 1/1 to 2/1.

A positive resist pattern may be produced on a substrate as follows. A solution of the polymer composition in a solvent such as, for example, 2-ethoxyethyl acetate, 2-methoxyethyl acetate or cyclohexanone, is coated on a substrate by using, for example, a spinner. Then, the coating of the polymer composition is usually heated to a temperature of 140° to 220° C. for a period of 5 to 30 minutes. The optimum temperature and time period are approximately 200° C. and approximately 15 minutes, respectively. The polymer network resist so formed is irradiated with ionizing radiation such as electron rays, X-rays or ultraviolet rays in accordance with a desired pattern until the acid-imide cross-links and the main chains are broken at the irradiated regions. The irradiated resist is developed by applying thereto a developer solvent, such as methyl isobutyl ketone, ethyl acetate or acetone so as to leave the positive resist pattern on the substrate.

The invention will be explained in more detail by the following illustrative examples, in which some of the characteristics of the positive resists were determined as explained. Irradiation was carried out in accordance with a vector scanning procedure by using an electron exposing apparatus (Cambridge Instrument EBMF-1).

Contrast "$\gamma$" was determined in accordance with the equation:

$$\gamma = 0.5/[\log(D_0/D_{0.5})],$$

wherein $D_0$ is the electron dose in C/cm$^2$ required to reduce the initial resist thickness to zero and $D_{0.5}$ is the electron dose in C/cm$^2$ required to reduce the initial resist thickness to a half thereof. The initial resist thickness was 0.5 micron as measured after the coated resist was baked in order to form cross-links.

Sensitivity was expressed in terms of the electron dose (C/cm$^2$) required to reduce the polymer resist thickness from 0.5 microns to zero, at least one part thereof, when the irradiated polymer resist was dipped in methyl isobutyl ketone or another liquid developer at a temperature of 20° C. for one minute. The smaller the electron dose, the greater the sensitivity.

Resolution was evaluated by determining the minimum possible size of each line and each space during the production of a parallel line resist pattern having lines and spaces of the same size, and further by determining the maximum possible height to width ratio of each linear ridge of the line pattern.

Thermal stability was evaluated in terms of the softening temperature, determined by using a scanning type electron microscope to observe the shape of the resist of a parallel line pattern while the resist was gradually heated in a nitrogen atmosphere. The softening temperature is defined as the lowest temperature at which the polymer resist loses its predetermined shape and starts to flow. Furthermore, thermal stability was evaluated in terms of the thermal decomposition temperature, which is determined according to a thermogravimetric analysis wherein a polymer resist specimen is heated in a nitrogen atmosphere at a rate of 10° C./min. The thermal decomposition temperature is defined as the temperature at which the weight of the specimen starts to be reduced.

EXAMPLE 1

95.0% by mole of methyl methacrylate (MMA), 2.5% by mole of methacrylamide (MAA) and 2.5% by mole of methacrylic acid chloride (ClMA) were copolymerized by using a conventional solution polymerization procedure. The terpolymer obtained (M.W.=250,000) was dissolved in 2-ethoxyethyl acetate to obtain a 9.0% by weight solution. This solution was coated on a silicon substrate using a spinner rotating at 4,500 rpm. The thickness of this coating when dry was 0.6 microns. The coated substrate was next heated at a temperature of 200° C. for a period of 15 minutes. Then, the coated substrate was irradiated with electron rays by using an electron beam accelerator at an accelerating voltage of 30 kV. The irradiated substrate was dipped in ethyl acetate at a temperature of 20° C. for one minute to obtain a resist of the line pattern (specimen 1).

For comparison purposes, similar positive resists were prepared from a terpolymer (M.W.=250,000, specimen 2) made from a mixture of 93.5% by mole of methyl methacrylate (MMA), 5% by mole of methacrylamide (MAA) and 1.5% by mole of methacrylic acid chloride (ClMA); a terpolymer (M.W.=250,000, specimen 3) made from a mixture of 89.5% by mole of methyl methacrylate (MMA), 10% by mole of methacrylamide (MAA) and 0.5% by mole of methacrylic acid chloride (ClMA); a terpolymer (M.W.=300,000, comparative specimen 1) made from a mixture of 95.0% by mole of methyl methacrylate (MMA), 2.5% by mole of methacrylic acid (MA) and 2.5% by mole of methacrylic acid chloride (ClMA); and a conventional polymethyl methacrylate (PMMA, M.W. 300,000, comparative specimen 2). The procedures used in the preparation of these positive resists were similar to those mentioned above with respect to the specimen of the present invention, except that the polymethyl methacrylate resist (comparative specimen 2) was developed at a temperature of 20° C. for one minute by using a methyl isobutyl ketone/isopropyl alcohol mixture having a volume ratio of ⅓.

The characteristics of the positive polymer resists are shown in Table I, below.

TABLE I

| Specimen | 1 | 2 | 3 | Com. 1 | Com. 2 |
|---|---|---|---|---|---|
| Composition MMA | 95.0 | 93.5 | 89.5 | 95.0 | 100 |
| (mole %) MAA | 2.5 | 5.0 | 10.0 | MA 2.5 | 0 |
| ClMA | 2.5 | 1.5 | 0.5 | 2.5 | 0 |
| Contrast (γ) | 5.8 | 5.2 | 4.3 | 4.0 | 3.1 |
| Sensitivity (C/cm$^2$) | $2 \times 10^{-5}$ | $1 \times 10^{-5}$ | $6 \times 10^{-6}$ | $5 \times 10^{-5}$ | $1.6 \times 10^{-4}$ |
| Resolution min. size of line and space (μ) | 0.2 | 0.2 | 0.2 | 0.2 | 0.2 |
| max. ratio of H/W | 7 | 6 | 6 | 6 | 2.5 |
| Thermal stability Softening temp. (°C.) | 145 | 150 | 155 | 140 | 110 |
| Decomposition temp. (°C.) | 320 | 320 | 330 | 300 | 250 |

EXAMPLE 2

Following a procedure similar to that mentioned in Example 1, a polymer resist pattern was produced wherein the following copolymer blend was used instead of the MMA/MAA/ClMA terpolymer. The copolymer blend used was comprised of 50% by weight of a copolymer (M.W.=250,000) of 92.0% by mole of methyl methacrylate (MMA) and 8.0% by mole of methacrylamide (MAA) and 50% by weight of a copolymer (M.W.=180,000) of 98.8% by mole of methyl methacrylate (MMA) and 1.2% by mole of methacrylic acid chloride (ClMA).

The characteristics of the polymer resist pattern are shown in Table II, below.

EXAMPLE 3

Following a procedure similar to that mentioned in Example 1, a polymer resist pattern was produced wherein the following terpolymer was used instead of the MMA/MAA/ClMA terpolymer. The terpolymer used was prepared by using a conventional solution polymerization procedure and was comprised of 95.0% by mole of benzyl methacrylate (BzMA), 4.0% by mole of methacrylamide (MAA) and 1.0% by mole of methacrylic acid chloride (ClMA). The terpolymer had a M.W. of approximately 200,000.

The characteristics of the polymer resist pattern are shown in Table II, below.

TABLE II

| Specimen | Ex. 2 | | Ex. 3 | |
|---|---|---|---|---|
| Composition | MMA | 46.0 | BZMA | 95.0 |
| (mole %) | MMA | 4.0 | MAA | 4.0 |
| | MMA | 49.4 | ClMA | 1.0 |
| | ClMA | 0.6 | | |
| Contrast (γ) | 4.3 | | 3.5 | |
| Sensitivity (C/cm$^2$) | $6 \times 10^{-6}$ | | $8 \times 10^{-6}$ | |
| Resolution min. size of lin | 0.2 | | 0.3 | |

TABLE II-continued

| Specimen | Ex. 2 | Ex. 3 |
|---|---|---|
| space (μ) | | |
| max. ratio of H/W | 6 | 5 |
| Thermal stability | | |
| Softening temp. (°C.) | 150 | 135 |
| Decomposition temp. (°C.) | 320 | 300 |

What is claimed is:

1. A cross-linkable positive working resist polymer composition comprising, a terpolymer comprised of
   (a) from about 70 to about 99% by mole of units derived from a methacrylic acid ester of the formula:

$CH_2=C(CH_3).COOR$

where R is selected from the group consisting of alkyls having from 1 to 6 carbon atoms, haloalkyls having from 1 to 6 carbon atoms, benzyl and cyclohexyl,
   (b) from about 1 to about 20% by mole of units derived from methacrylamide, and
   (c) from about 0.05 to about 20% by mole of units derived from methacrylic acid chloride;

each amount of the units (a), (b) and (c) being based on the total moles of the units (a), (b) and (c).

2. A polymer composition according to claim 1, wherein the molar ratio of the units (b) to the units (c) ranges from about ⅔ to about 100/3.

3. A polymer composition according to claim 1 or 2, wherein the amount of the units (b) ranges from about 2 to about 10% by mole based on the total moles of the units (a), (b) and (c).

4. A polymer composition according to claim 1 or 2, wherein the amount of the units (c) ranges from about 0.3 to about 3% by mole based on the total moles of the units (a), (b) and (c).

5. A polymer composition according to claim 1 or 2, wherein the methacrylic acid ester is comprised of at least one monomer selected from the group consisting of methyl methacrylate, tert. butyl methacrylate, cyclohexyl methacrylate and benzyl methacrylate.

6. In a method of forming a positive resist pattern on a substrate, of the type including the steps of
   (i) coating the substrate with a solution of a cross-linkable positive-working polymeric material,
   (ii) heating the coated substrate to form cross-links in the polymer resist coating,
   (iii) irradiating the cross-linked polymer resist with ionizing radiation or ultraviolet rays in accordance with a desired pattern, and then
   (iv) applying a solvent to the irradiated polymer resist thereby to leave the desired positive resist pattern on the substrate, the improvement comprising: using as the cross-linkable positive-working polymeric material in step (i) a polymer composition comprising, a terpolymer comprised of
   (a) from about 70 to about 99% by mole of units derived from a methacrylic acid ester of the formula:

$CH_2=C(CH_3).COOR$

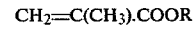

wherein R is selected from the group consisting of alkyls having from 1 to 6 carbon atoms, haloalkyls having from 1 to 6 carbon atoms, benzyl and cyclohexyl,
(b) from about 1 to about 20% by mole of units derived from methacrylamide, and
(c) from about 0.05 to about 20% by mole of units derived from methacrylic acid chloride;

each amount of the units (a), (b) and (c) being based on the total moles of the units (a), (b) and (c).

7. A method according to claim 6, further comprising using a molar ratio of the units (b) to the units (c) in the range of from about ⅔ to about 100/3.

* * * * *

UNITED STATES PATENT AND TRADEMARK OFFICE
CERTIFICATE OF CORRECTION

PATENT NO. : 4,273,856
DATED : June 16, 1981
INVENTOR(S) : Yasuhiro Yoneda et al.

It is certified that error appears in the above-identified patent and that said Letters Patent are hereby corrected as shown below:

[86], line 2, "Jul. 2, 1979" s/b --Jul. 7, 1979--;

line 3, "Jul. 7, 1979" s/b --Jul. 2, 1979--.

[57] Abstract, line 8, "$CH_2=C(CH_3).COOR$" s/b

--$CH_2=C(CH_3) \cdot COOR$--.

Col. 1, line 4, delete "DESCRIPTION";

line 41, after "chloride" insert --,--;

line 67, "$CH_2=C(CH_3).COOR$" s/b --$CH_2=C(CH_3) \cdot COOR$--.

★ Col. 2, line 30, "above mentioned" s/b --above-mentioned--.

★ Col. 5, line 68, "lin" s/b --line and--.

Col. 6, line 16, "$CH_2=C(CH_3).COOR$" s/b

--$CH_2=C(CH_3) \cdot COOR$--;

line 65, "$CH_2=C(CH_3).COOR$" s/b --$CH_2=C(CH_3) \cdot COOR$--.

Signed and Sealed this

Twelfth Day of January 1982

[SEAL]

Attest:

GERALD J. MOSSINGHOFF

*Attesting Officer*    *Commissioner of Patents and Trademarks*

UNITED STATES PATENT AND TRADEMARK OFFICE
CERTIFICATE OF CORRECTION

PATENT NO. : 4,273,856
DATED : June 16, 1981
INVENTOR(S) : Yasuhiro Yoneda et al.

It is certified that error appears in the above—identified patent and that said Letters Patent is hereby corrected as shown below:

ON THE TITLE PAGE:

[75] "Inventors" should be --Yasuhiro Yoneda, Yokohama; Toshisuke Kitakohji, Machida; Kenro Kitamura, Fujisawa, all of Japan--.

Signed and Sealed this

Sixteenth Day of March 1982

[SEAL]

*Attest:*

GERALD J. MOSSINGHOFF

*Attesting Officer*  *Commissioner of Patents and Trademarks*